(12) United States Patent
Arnold et al.

(10) Patent No.: US 6,768,654 B2
(45) Date of Patent: Jul. 27, 2004

(54) MULTI-LAYERED STRUCTURES AND METHODS FOR MANUFACTURING THE MULTI-LAYERED STRUCTURES

(75) Inventors: Rocky R. Arnold, San Carlos, CA (US); John Zarganis, Redwood City, CA (US); Steve Toyama, Livermore, CA (US)

(73) Assignee: Wavezero, Inc., Sunnyvale, CA (US)

( * ) Notice: Subject to any disclaimer, the term of this patent is extended or adjusted under 35 U.S.C. 154(b) by 0 days.

(21) Appl. No.: 09/947,229

(22) Filed: Sep. 4, 2001

(65) Prior Publication Data

US 2002/0071940 A1 Jun. 13, 2002

Related U.S. Application Data

(60) Provisional application No. 60/233,259, filed on Sep. 18, 2000.

(51) Int. Cl.⁷ .............................. H05K 9/00; H05K 5/00
(52) U.S. Cl. ...................... 361/818; 361/800; 361/816; 361/752; 174/35 R; 174/35 GC
(58) Field of Search ................................. 361/800, 816, 361/818, 752; 174/35 R, 35 GC, 35 MS

(56) References Cited

U.S. PATENT DOCUMENTS

| | | | |
|---|---|---|---|
| 3,620,872 A | | 11/1971 | Backwell |
| 3,645,822 A | | 2/1972 | Widiger et al. |
| 4,329,196 A | | 5/1982 | Rawlinson |
| 4,423,106 A | | 12/1983 | Mahn |
| 4,631,214 A | * | 12/1986 | Hasegawa ..................... 428/68 |
| 4,678,699 A | | 7/1987 | Kritchevsky et al. |
| 4,774,148 A | * | 9/1988 | Goto .......................... 428/607 |
| 4,824,506 A | | 4/1989 | Hoerner et al. |
| 4,913,760 A | | 4/1990 | Benson et al. |
| 4,965,408 A | * | 10/1990 | Chapman et al. ...... 174/35 MS |
| 5,028,490 A | | 7/1991 | Koskenmaki et al. |
| 5,285,619 A | * | 2/1994 | Jones .......................... 53/431 |
| 5,286,528 A | | 2/1994 | Reafler |
| 5,355,016 A | * | 10/1994 | Swirbel et al. ............. 257/659 |
| 5,373,102 A | * | 12/1994 | Ehrlich et al. ............ 174/35 R |
| 5,394,304 A | * | 2/1995 | Jones ......................... 361/765 |
| 5,395,659 A | | 3/1995 | Gräf et al. |
| 5,436,803 A | * | 7/1995 | Annis et al. ................ 361/818 |
| 5,468,910 A | | 11/1995 | Knapp et al. |
| 5,524,697 A | | 6/1996 | Cook |
| 5,538,576 A | | 7/1996 | Knop et al. |
| 5,739,463 A | * | 4/1998 | Diaz et al. ................ 174/35 R |
| 5,811,050 A | | 9/1998 | Gabower |
| 5,837,086 A | | 11/1998 | Leeb et al. |
| 5,864,088 A | * | 1/1999 | Sato et al. ............. 174/35 MS |
| 5,925,847 A | * | 7/1999 | Rademacher et al. ..... 174/35 R |
| 5,938,979 A | * | 8/1999 | Kambe et al. .............. 252/500 |
| 5,945,059 A | | 8/1999 | Atake |
| 5,990,417 A | * | 11/1999 | Senda et al. ........... 174/35 MS |
| 6,030,708 A | | 2/2000 | Ishibashi et al. |
| 6,086,979 A | * | 7/2000 | Kanbara et al. ............ 428/209 |
| 6,090,728 A | | 7/2000 | Yenni, Jr. et al. |
| 6,094,361 A | * | 7/2000 | Batten et al. ................ 361/816 |
| 6,097,613 A | * | 8/2000 | Batten et al. ................ 361/816 |
| 6,147,879 A | * | 11/2000 | Batten et al. ................ 361/800 |
| 6,197,408 B1 | * | 3/2001 | Kanbara et al. ............ 428/209 |
| 6,206,998 B1 | | 3/2001 | Niazy |
| 6,262,364 B1 | * | 7/2001 | Yoshikawa et al. ..... 174/35 MS |
| 6,455,770 B2 | * | 9/2002 | Pulver ................... 174/35 MS |

* cited by examiner

*Primary Examiner*—David Martin
*Assistant Examiner*—Dameon E. Levi
(74) *Attorney, Agent, or Firm*—Townsend and Townsend and Crew LLP

(57) ABSTRACT

Multi-layered molds and methods for manufacturing multi-layered molds. A metallized layer can be deposited on at least one side of a substrate. The substrate can be shaped and then the metal layer can be deposited onto the shaped substrate. Optionally, an injection molded resin can be deposited onto the substrate and/or metal layer.

10 Claims, 8 Drawing Sheets

MULTI-LAYERED STRUCTURES AND METHODS FOR MANUFACTURING THE MULTI-LAYERED STRUCTURES

CROSS-REFERENCES TO RELATED APPLICATIONS

The present application claims benefit to U.S. Provisional Patent Application S.N. 60/233,259, filed Sep. 18, 2000, the complete disclosure of which is incorporated herein by reference.

BACKGROUND OF THE INVENTION

The present invention relates generally to multi-layered structures or laminates and methods for manufacturing the multi-layered structures. In particular, the present invention relates to multi-layered structures having a shielding layer for blocking transmission of electromagnetic interference.

All electronic products emit electromagnetic radiation, generally in the range of 50 MHz to 1 GHz, but not limited to this range, especially considering the recent advances in high-speed microprocessor design and the rapidly increasing capabilities of high-speed networking and switching. The problem of emittance of electromagnetic radiation is not new to designers of electronic equipment; indeed, significant efforts are taken to reduce electromagnetic interference, electrostatic discharge, radiofrequency interference (hereinafter referred to collectively as "EMI") and virtually every county has a regulating agency (FCC in the U.S., for instance) that restricts the marketing and sale of electronic equipment that do not pass stringent requirements for EMI, whether radiation or intercepted (also called susceptibility) by an electronic device.

Present day solutions for EMI shielding generally include the use of conductively painted plastic housings, conductive gaskets, and metal cans that are affixed to the printed circuit board by soldering or similar methods, some of which are semi-permanent. In virtually all cases, however, the existing solutions are expensive and add to the cost of providing electronic equipment such as cell phones, personal digital assistants, laptop computers, set-top boxes, cable modems, networking equipment including switches, bridges, and cross-connects.

In an effort to bring costs down while increasing shielding, various technologies for the metallization of polymer substrates has been developed. For example, U.S. Pat. No. 5,028,490 to Koskenmaki describes layering a polymer substrate with aluminum fibers and sintered to form a flat material with a metal coating that is intended to provide effective EMI control (also called electromagnetic control or EMC). In actual use, however, the material has been shown to be expensive, difficult to use, and subject to inferior performance due to cracking of the metallized layer. Unfortunately, the metal-layered material has not been able to withstand a thermoformed process due to the typical tight radius used in the thermoforming molds.

U.S. Pat. No. 5,811,050 to Gabower, the complete disclosure of which is incorporated herein by reference, has provided an alternative approach wherein the thermoformable substrate (any number of polymers) is first formed and then metallized. This approach offers the advantage of eliminating the stresses to metallized layer created during molding. The product has been shown to be highly effective and relatively low-cost.

Plastic housings, because they are not conductive, provide no shielding of electromagnetic radiation. Attempts to provide plastic with a conductive feature include intrinsically conductive plastics and plastics loaded with conductive fillers (carbon or nickel flakes, for instance). Generally, these plastics are prohibitively expensive, or at least not economically feasible given alternative technologies (cans, gaskets, and conductive painting). Additionally, the level of shielding effectiveness is also small, typically less than 40 dB, whereas the demands of many computing devices, both mobile and fixed, require shielding effectiveness greater than 40 dB.

Historically, metals have been used for housings of fixed location equipment and electronic devices. Fixed electronics, such as personal computers, printers, fax machines, etc. are typically contained in metal housings or, if plastic housings are used, the printed circuit boards (PCBs) are shielded in some manner (cans, for instance on selected high-emission components and traces). Mobile devices often used plastic housings and some combination of conductive gaskets, metal cans, and conductive painting of the housing to achieve the desired shielding effectiveness. As the frequency of emissions increases as a result of smaller components, circuits, and the closer locating of analog/digital circuits, the need for shielding increases and the need for greater shielding effectiveness also increases. The drive to create smaller, lighter mobile products also creates a need for lighter and thinner shielding solutions.

Recently, the use of in-mold and insert-mold plastic molding processes have become of great interest to the electronics packaging industry. With in-mold processes, a relatively thin material is drawn into or placed into a plastic injection mold and used as a "dam" or backstop for the injection plastic material that typically becomes the structural housing. Such processes provide some interesting design features for a variety of products.

While the in-mold processes have been effective in creating decorative housings, the current in-mold processes, however, do nothing to solve the difficult issue of EMI shielding.

BRIEF SUMMARY OF THE INVENTION

The present invention provides multi-layered inserts, laminates, housings, and electronic devices that have a metal layer that provides improved decorative features and/or EMI shielding.

In exemplary uses, the multi-layered structures of the present invention can be used to create housings and electronic devices that have an EMI shield integrated with the housing. The housings of the present invention can provide shielding of greater than 40 dB for radiation in the range of 50 MHz to 1 GHz, or more. In addition to providing EMI shielding, the metal layers of the present invention can also provide a decorative layer, such as a "metallic look" or a reflective surface. The integrated plastic/shielding housing can be used for both fixed and mobile electronic products.

In general, the electronic devices of the present invention include a housing having film layer, at least one metal layer having a thickness that is sufficient to block the transmission of EMI, and a resin layer. The electronic devices typically include a printed circuit board disposed within the shielded housing in which the EMI shield layer is grounded.

The film layers incorporated into the structures of the present invention will typically be shaped to a desired form prior to the deposition of the resin onto the film. In exemplary embodiments, the film layer is a thermoform that is shaped using conventional thermoforming techniques (e.g., vacuum, pressure, or mechanical forces). It should be appreciated however, that the film layer can be shaped using any conventional or proprietary methods.

The metal layers of the present invention are also typically attached to the film layer after shaping of the film layer. If the metal layer is applied prior to shaping of the film layer, the shaping process (e.g., thermoforming) tends to stretch out and weaken portions of the metal layer. Such stretching and thinning has been found to weaken and sometimes destroy the EMI capabilities of the metal layer. The EMI shields of the present invention will generally have a substantially even thickness that is sufficient to block the passage of EMI. Typically, the metal layer will have a thickness between approximately 1 microns and 50 microns. In such embodiments, the metal layer will typically be grounded so as to create a Faraday cage.

Typically, the metal film layer is deposited onto the film layer using vacuum metallization. Vacuum metallization is one preferred method because of the substantially even layer of metal that can be applied to the shaped film to create the EMI shield. It should be appreciated however, that other methods of depositing the metal layer to the substrate can be used without departing from the scope of the present invention. For example, instead of vacuum metallization, other methods such as a depositing a random mat or fiber weave, sputtering, painting, electroplating, deposition coating, electroless plating, laminated conductive layers, or the like, can be used to deposit the metal layer onto the multi-layered laminate.

It should be appreciated that, in addition to EMI shielding, the metal layers of the present invention can be also used for decorative purposes or reflective purposes. Such metal layers are typically composed of materials such as aluminum and its alloys, copper and its alloys, tin and its alloys, silver and its alloys, nickel and its alloys, or the like. Additionally, instead of a single layer, it is possible to apply two or more layers using the same or different materials. For example, in some embodiments it may be possible to apply a nickel layer and a tin layer over the polymer film layer. In one preferred embodiment, an aluminum metal layer created by vacuum metallization has a luster and reflective properties similar to that of chrome. Such a metal layer is beneficial, particularly when the metal layer is used as a reflector.

Depending on the combination of materials and the sequence of deposition, the multi-layered structure may need a protective undercoat to improve adhesion between layers or an overcoat to protect the top layer of the laminate. Thus, as used herein, "coupling two layers" or "attaching two layers" are meant to encompass both directly and indirectly (e.g., another layer in between the two layers) bonding the two layers together.

The present further includes shielded/decorated inserts for an in-mold and insert-mold processes. Multi-layered inserts of the present invention for the in-mold manufacturing process includes a shaped substrate (such as a thermoform) having a decorative feature disposed along at least one surface. A metallized layer can be disposed over at least one of the substrate and decorative feature.

Methods of in-mold and insert mold shielding of the present invention include forming a multi-layered laminate for use in an in-mold process. A decorative feature can be applied to at least one surface of a substrate. The decorated substrate is then shaped into a desired shape. A metal layer is then deposited onto at least one surface of the decorated and shaped substrate.

After the multi-layered insert is manufactured (either locally or remotely), the shaped metallized substrate can be manually or robotically placed into an injection molding chamber and an injection molding resin can be deposited on the metallized substrate. The resulting multi-layered laminate from the in-mold process provides a pre-shaped film having a metal layer coupled thereto, and an injection molded plastic structured coupled to either the film or the metal layer.

In exemplary embodiments, the metal layer coupled to the substrate has a thickness that is sufficient to act as an EMI shield. Thus, if the shaped substrate is formed into a housing for an electronic device, the electronic device will have a conformal EMI shield integrated into its housing. Optionally, the multi-layered structure can include a second metal layer. The second metal layer can be decorative in nature or for aesthetic purposes.

One or both of the first and second metal layer can be used to create a bright, reflective, and shiny surface to provide a design element. With the second metal layer containing a decorative image on a first side of the substrate and EMI shielding on a second side of the substrate, a highly effective and aesthetically designed electronics product can be produced.

In another aspect, the present invention provides structures and methods for grounding a metallized layer, such as a shielded electronic housing with a ground trace of a printed circuit board. In exemplary embodiments, the grounding methods comprises placing a solder paste over ribbed portions of the electronic housing to mechanically and conductively contact the ground traces on the printed circuit board. In another exemplary embodiment, the present invention creates a via or perforation in the electronic shield and deposit a conductive adhesive or molten solder to create a mechanical and conductive bond between the metal layer on the shield and the ground trace. Other methods include soldering, ultrasonic welding, conductive adhesives, laser melting, and the like.

A further understanding of the nature and advantages of the invention will become apparent by reference to the remaining portions of the specification and drawings.

DETAILED DESCRIPTION OF THE INVENTION

The methods and devices of the present invention provide improved multi-layered structures that provide improved decorative features and/or an EMI shield. The multi-layered structures or laminates of the present invention provide a laminate having a film layer, a metal layer, and a resin layer to create the multi-layered laminate. In exemplary embodiments, the structures and methods of the present invention can be used to create a conformal EMI shield that can fit integrally with a shaped outer housing of an electronic device.

The multi-layered structures or laminates of the present invention can take a variety of forms. Generally, the multi-layered laminate includes a film, a metal layer, and a resin layer. It should be appreciated that for ease of reference, the multi-layered structures of the present invention are shown as being planar for illustration purposes only. The multi-layered structures of the present invention can take any variety of symmetrical or non-symmetrical three-dimensional forms to create housings for a variety of electronics, reflectors, microwave components, wireless product, personal computers, external CD-ROM drives, or the like. For example, the multi-layered laminate can be designed to fit the form factor of fixed personal computers or printers in which the housing would be on the order of several feet in any direction. Alternatively, the multi-layered laminate could be designed to fit a form factor for mobile products in which case the housing would be on the order of several inches in any direction.

Figure 1:
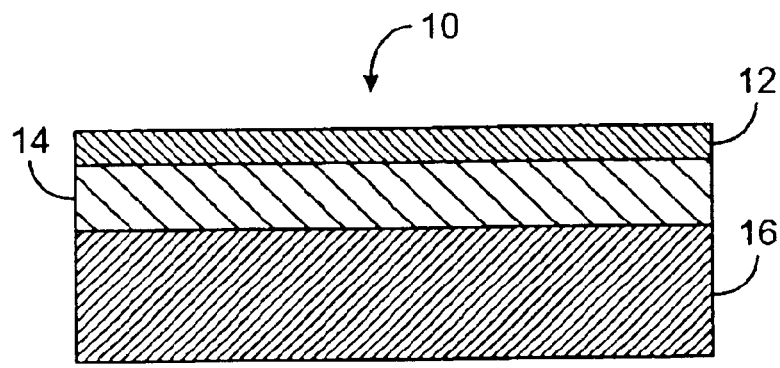
FIGS. 1 to 10 are simplified cross sectional views of a multi-layered structure incorporating the present invention.
Figure 2:
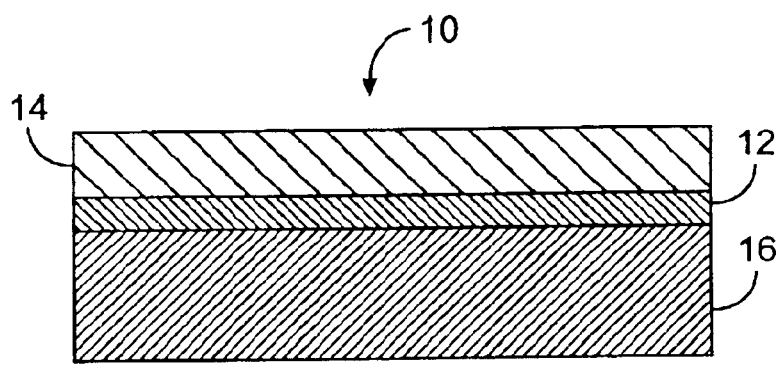

FIGS. 1 and 2 illustrate a portion of exemplary multi-layered structures 10 of the present invention. Multi-layered structure 10 includes a metal layer 12 disposed on a film 14 (to create a metallized film) and a resin 16 coupled to either the film 14 or metal layer 12. As illustrated in FIG. 1, film 14 can be disposed between resin 16 and metal layer 12. Alternatively, as shown in FIG. 2, the metal layer 12 can be disposed between film 14 and resin 16.

Figure 3:
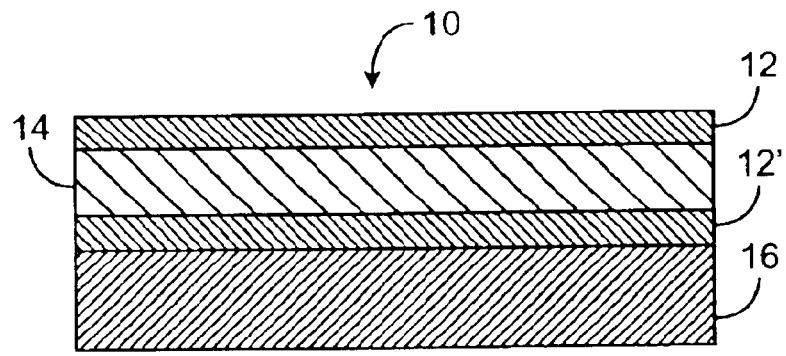

In other embodiments, as shown in FIG. 3, multi-layered structure 10 can include metal layers 12, 12' along both surfaces of film 14. The two metal layers have been found to improve shielding efficiency, and increase available conductive surface area to be used for grounding connection points.

Figure 4:
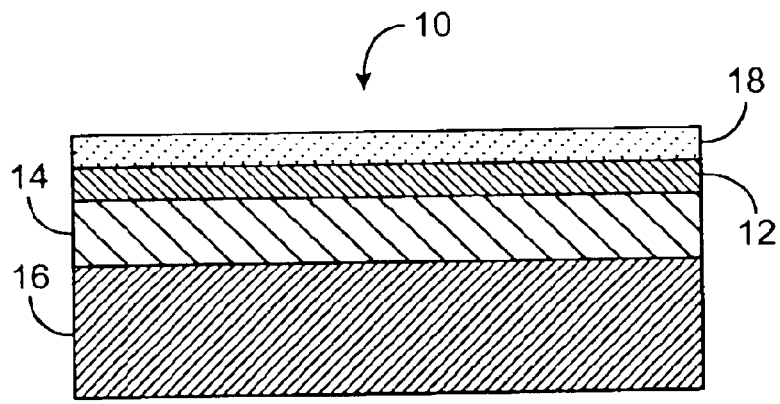

If metal layer 12 is exposed, as shown in FIG. 4, it may be desirable to place an elastomer topcoat layer 18, such as a urethane, or the like, over at least a portion of metal layer 12 so as to protect metal layer 12. If metal layer 12 is an EMI shield, topcoat layer 18 can help maintain the metal layer's electrical conductivity while preventing scratches, electrical breaks, and the like. If metal layer 12 is a decorative or reflective layer, topcoat layer 18 can maintain the metal layer's luster and/or prevent metal layer from wearing out.

Alternatively, as shown in FIG. 4, if metal layer 12 is sandwiched between film 14 and resin 16, to protect metal layer 12 during manufacturing, an elastomer undercoat, a micro-cellular foams, or the like, can be used to create a barrier between the molten resin during the injection molding process.

Figure 5:
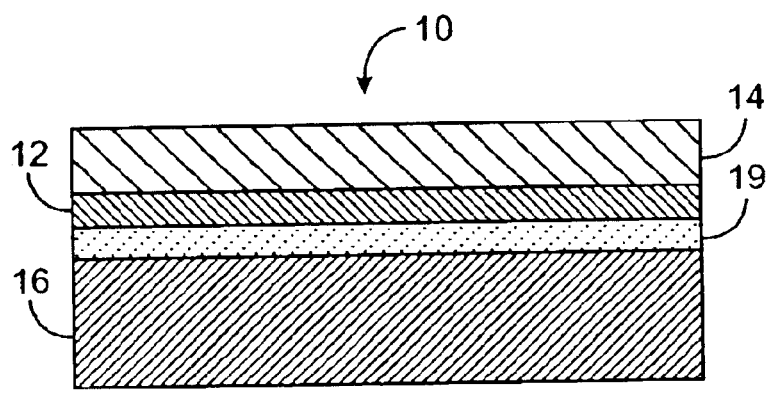

In the embodiment of FIG. 5, an undercoat 19 can be applied between the metal layer 12 and resin 16 so as to protect metal layer 12 during the heat generated during the injection molded process. The undercoat can improve the bonding characteristics between resin layer 16 and metal layer 12.

Metal layer 12 of the present invention can serve a variety of purposes. In the embodiments illustrated in FIGS. 1 to 5, metal layer 12 can either be a decorative layer, a functional layer, or both. The functional metal layer may be used as an electromagnetic interference shield, electrostatic discharge shield, radiofrequency interference shield, and/or for increasing the available conductive surface for grounding connection points. If metal layer 12 is an EMI shield, the metal layer will generally have a thickness between approximately 1 micron and 50 microns, so as to be able to provide shielding effectiveness greater than approximately 40 dB and to block the passage of electromagnetic radiation between the range of 50 MHz to 1 GHz, or more.

In embodiments where metal layer 12 is used purely for decorative purposes, metal layer need not be conductive and metal layer 12 can have a smaller thickness, than the above cited ranges. Moreover, the decorative layer will oftentimes be applied only to a portion of film 14. Optionally, metal layer 12 can be colored so as to provide a better decorative effect.

In exemplary embodiments, metal layer 12 can be deposited onto film layer 14 such that the metal layer acts as a decorative, reflective surface. In such cases, the multi-layered structure 10 can be used as reflectors for automotive vehicles (e.g., cars, planes, etc), as an external housing for electronic equipment, badges, nameplates, or the like. One advantage of such a configuration is that the metal layer can be viewed through a protective layer, such as clear or colored resin 16 or overcoat 18. Unlike conventional printing methods, which often place the decorative features on an external, exposed surface, by placing the metal layer behind a protective layer, the luster and decorative features of the metal layer can be maintained for a longer period of time. Additionally, if metal layer 14 is formed in the shape of letters (such as a warning or instructions), the decorative features can be protected from delamination, abrasion, and wear, and a user will be prevented from rubbing such letters off.

Metal layer 12 can be deposited into multi-layered mold through a variety of methods. In exemplary methods, the metal layer 12 can be vacuum metallized onto film 12. Vacuum metallization has been found to provide a smoother, mirror like finish that can create a reflective surface. For example, Applicants have found that vacuum metallized aluminum provides a surface finish similar to that of chrome. A more complete description of vacuum metallization of a thermoform can be found in commonly owned U.S. Pat. No. 5,811,050 to Gabower, the complete disclosure of which is incorporated herein by reference.

Film layers 14 of the present invention can also take a variety of forms. Exemplary material include, but are not limited to, a thermoplastic resin such as polyvinyl chloride, an acrylic resin, polystyrene, acrylic, acrylonitrile butadiene styrene, cellulose acetate, cellulose propionate, cellulose acetate butyrate, high density polyethylene, nylon, polycarbonate, polypropylene, ABS resin, intrinsic conductive polymers (ICP), or the like.

As is known in the art, resin 16 is typically applied to the metallized film through an injection molding process. As will be described in more detail below, metallized film will typically be shaped prior to the injection molding. Resin layer 16 can include various types of resin, depending on the application, final product, and the like. Some examples of suitable resins include, but is not limited to, polycarbonate, polycarbonate and ABS blends, PETG, PBT, PC/PETG blends, intrinsic conductive polymers (ICP), and the like.

Some additional combinations for multi-layered structures 10 of the present invention are illustrated in FIGS. 6 to 10. Multi-layered structure can include one or more decorative layers 20 in addition to a shielding layer 22. Shielding layer will generally have the same characteristics as metal layer 12 described above. Decorative layer 20, however, can include any of a variety of conventional or proprietary decorative layers. Decorative layer can include an aesthetic layer of non-conductive paint, a colored or transparent film, or other non-functional layers. Such decorative layers can be deposited via pad printing, screen printing, heat transfer molding, sublimation ink-transfer, printable masks, or the like.

Figure 6:
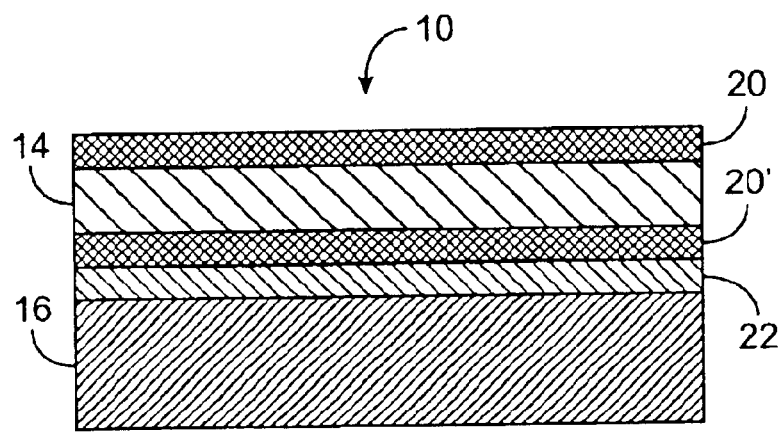
Figure 7:
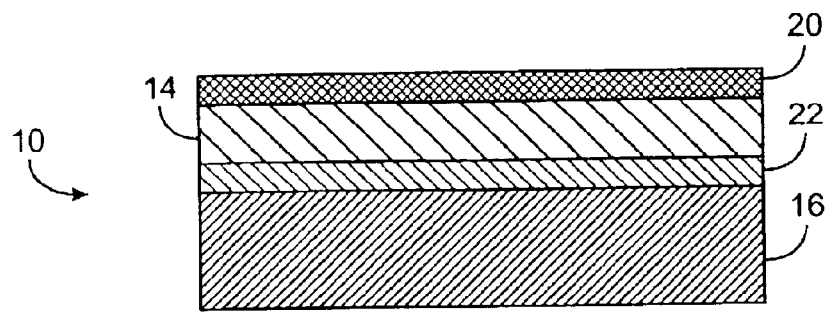

As illustrated in FIG. 6, in some embodiments, both a first surface and a second surface of film 14 can be decorated with a decorative layer 20, 20'. A metal, shielding layer 22 can be coupled to at least one of the decorative layers (in this embodiment 20') to provide shielding to any electronic components disposed within or behind multi-layered structure 10.

Figure 8:
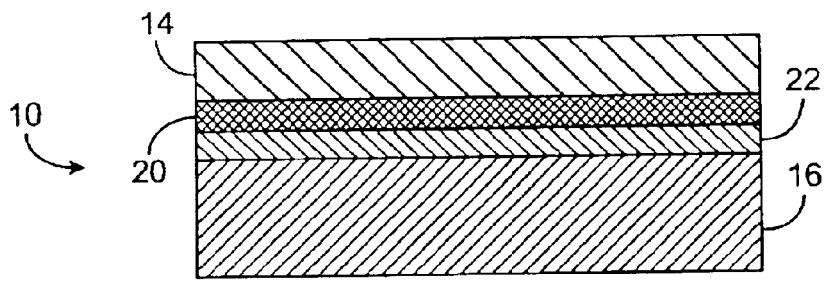
Figure 9:
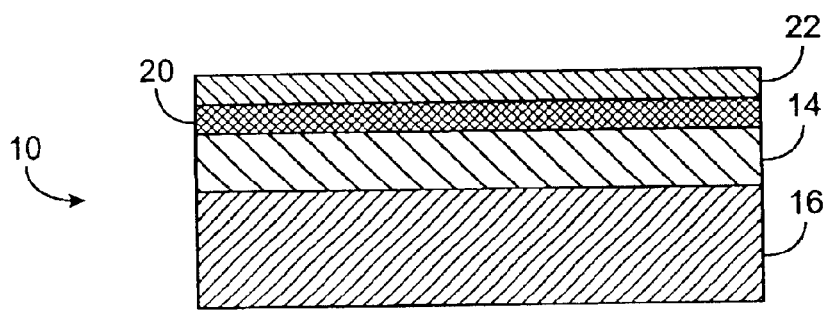
Figure 10:
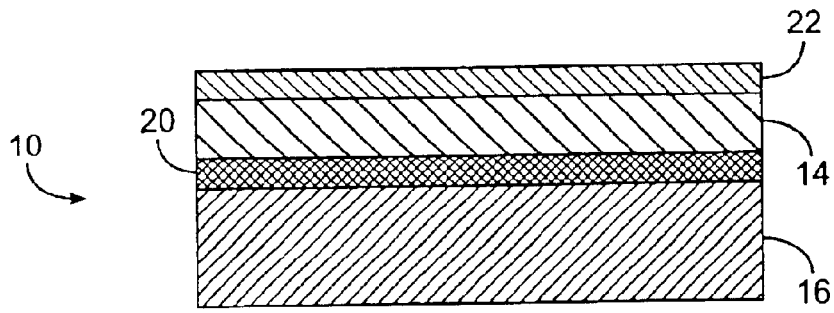

As shown in FIGS. 7 to 10, film layer 14 can have a decorative layer 20 disposed along only one surface. In such embodiments, the metal layer 22 can be coupled to the film layer 14 directly (FIGS. 7 and 10) or indirectly (FIGS. 8 and 9).

In FIG. 8, film layer 14 can be clear and would be the outside surface of the end product allowing the decoration layer to be visible through clear film layer 14. Alternatively, resin layer 16 can be along the outside surface of the housing and can be clear, thus allowing visibility through layer 16. In regards to FIG. 9, layers 14, 16 can be clear and/or layer 22 does not cover the decoration.

In each of the embodiments, depending on its specific use, resin layer 16 can either be along an outer surface or inner surface of the final product. For example, in FIG. 2, a clear or colored resin 16 can be on an outer surface of an electronics housing, such that metal layer 12 can be viewed through the resin layer. Alternatively, FIG. 4 illustrates an embodiment in which overcoat 18 can be positioned along an outer surface of the final product so as to protect metal layer 12 from the environment. It should be appreciated however, that the flexibility provided by the concepts of the present invention allow the combination of FIG. 4 to be switched such that resin layer 16 is along the outer surface of the final product, and overcoat layer 18 can be an insulating layer to provide protection from incidental contact of any enclosed electronics with the conductive portions of the shield.

Figure 11:
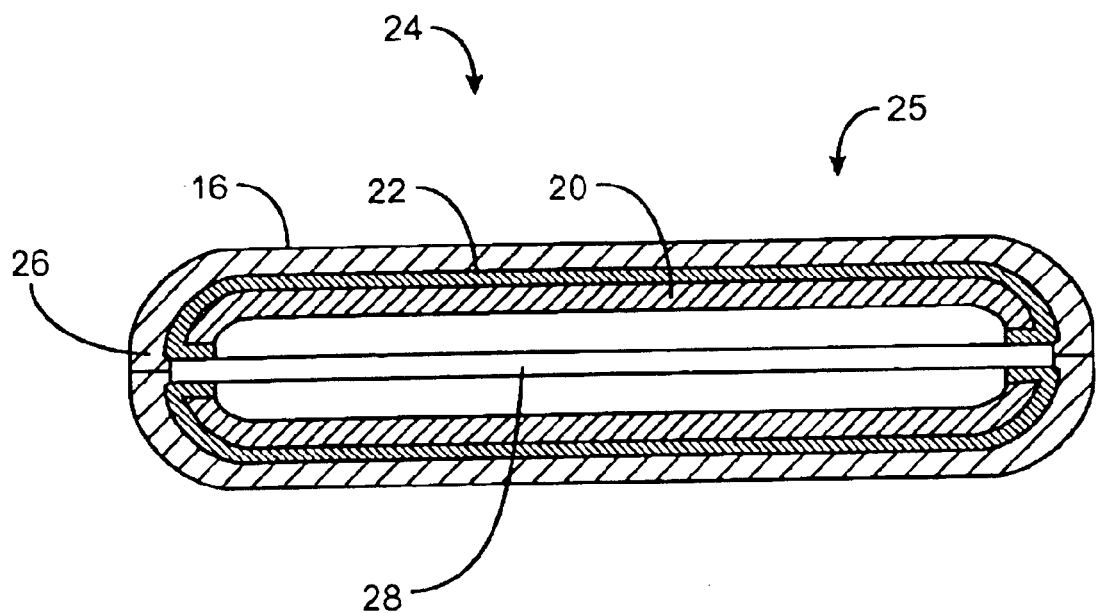
FIG. 11 illustrates an exemplary electronic housing incorporating the present invention.

Exemplary uses of the multi-layered structures 10 of the present invention include forming an electronic device 24, such as a cellular phone housing, personal digital assistant (PDA), laptop computers, video game consoles, or other devices which use a plastic housing. As shown in FIG. 11, housing 25 of electronic device 24 will typically include any of the above combinations of resin layer 16, metal shielding layer 22, and decorative layer 20. In such embodiments, in order to ground the metal shielding layer and to create a Faraday cage, the metal shielding layer can use a grounding element 26, such as a conductive tab, conductive adhesive, threaded metal screws for housing, gaskets, or the like, to ground the metal shielding layer to a ground trace of a printed circuit board 28. Electronic devices 24 having an integrated plastic/shielding structure that provides the required shielding and mechanical protection of enclosed electronics can be produced at a lower cost, are lighter weight, and can have a more compact design than would otherwise be achieved with alternative solutions.

Figure 12:
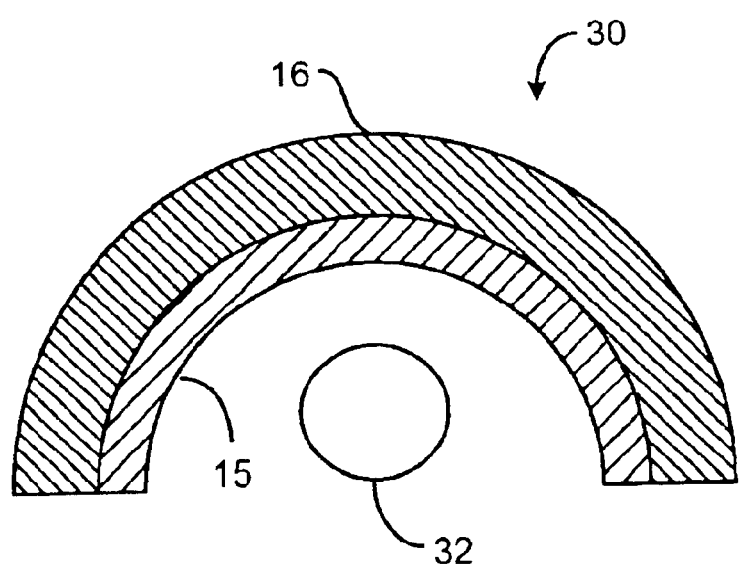
FIG. 12 illustrates a simplified light housing incorporating the present invention.

In other exemplary uses, as shown in FIG. 12, the present invention can be used to create improved reflective surfaces, such as a lamp housing, vehicle reflectors or head lights, flashlights, or the like. In such embodiments, the resin 16 and metallized film 15 can be formed to create a lamp housing 30 so as to reflect and focus light that is emitted from a light source 32.

Figure 13:
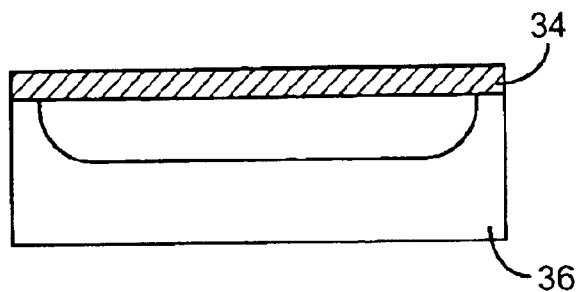
FIGS. 13 to 15 illustrates an exemplary method of shaping and metallizing a film.
Figure 14:
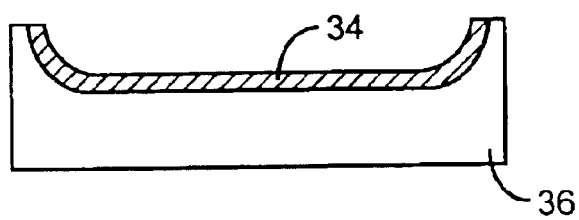

FIGS. 13 to 18 illustrate a simplified method of manufacturing the multi-layered structure of the present invention. As shown in FIG. 13, flat film 34, such as a thermoform film, can be positioned over a male or female vacuum mold 36 and the film can be formed using a variety of conventional thermoforming methods, including vacuum forming, pressure forming, and/or plug assist (FIG. 14).

In some methods, the flat film 34 can be pre-decorated on at least one side, as shown by reference numerals 35, 35'. As can be appreciated, the decorative feature will be modified to account for the known deformation that will take place during shaping. Some exemplary decorating methods are printable masks, screen printing, hot stamping, painting, silkscreening, pad printing, or the like.

In other embodiments, it may be possible to decorate the film after shaping flat film 34. For example, for complicated designs it may be more cost effective to post form the complicated decorations that may be distorted during forming.

Figure 15:
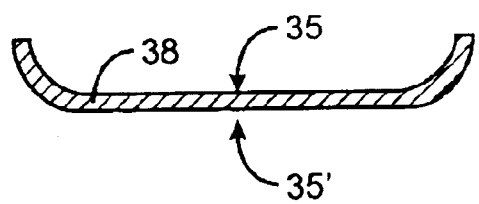
Figure 16:
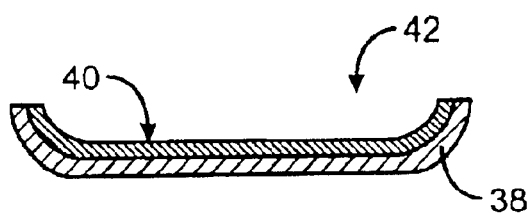
FIGS. 16 to 18 illustrate an exemplary method of injection molding the shaped, metallized film of FIG. 13.

Optionally, after the film has been formed into its desired shape, if the film has not already been pre-decorated, one or both sides of film 34 can be decorated with a metal or non-metal decorative feature 35, 35' to create the decorated and shaped insert 38 (FIG. 15). If desired, the shaped and decorated insert 38 can be metallized with a metal layer 40 (FIG. 16). As noted above, if metal layer 40 is an EMI shield, it is preferable to deposit the EMI shield 40 after film 38 has been shaped. By depositing the metal layer 40 on the pre-shaped film 38, the continuity and shielding effectiveness of the metal layer 40 can be maintained so as to provide effective EMI shielding.

While it is possible to metallize the film prior to shaping, Applicants have found that the metal layer tends to thin or crack at the curves and sharp bends during the shaping process. Such thinning and cracking reduces the shielding effectiveness of metal layer 40.

In exemplary embodiments, metal layer 40 and decorating layer can be deposited through a vacuum metallization process. The vacuum metallization process has been shown to produce a substantially even layer, and thus a substantially even EMI shield. It should be appreciated however, that other methods of depositing the metal layer can be used. For example, other methods of depositing the metal layer 40 onto film 34 include painting, sputtering, electroplating, deposition coating, electroless plating, laminated conductive layers, or the like. For example, while it is possible to paint a conductive layer onto film 34, conventional conductive paints and inks only provide a shielding effectiveness of less than approximately 45 dB. Moreover, such paints and inks require the use of silver as part of the basic material, and such silver paints are not environmentally sound since the deposition process creates extensive organic volatile emissions. Recycling of such painted structures is further problematic because of state and federal regulations against the dumping of silver based paints. For these reasons, vacuum metallization of an aluminum (or other environmentally safe material) is preferred over painting with conductive paints and inks.

Figure 17:
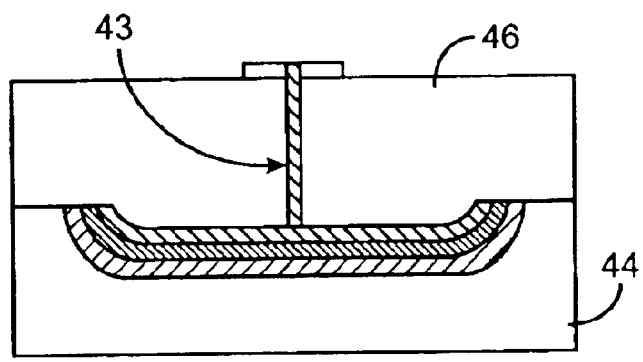
Figure 18:
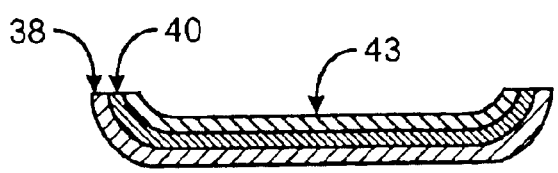

As shown in FIG. 17, the pre-shaped and metallized insert 42 is manually or robotically placed in an injection molding cavity 44. As is know in the art, the injection mold typically includes an injection mold cavity 44 and core 46. The injection mold core 46 typically includes a runner/gate in which the molten plastic is injected into the cavity. The molten plastic resin 43 is delivered into the injection mold cavity 44 so as to contact the metallized insert 42. In the illustrated embodiment of FIG. 18, the molten resin 43 directly contacts the metal layer 40. In other embodiments, however, the molten resin can contact an undercoat 19 (FIG. 5) or the film layer 14 (FIG. 1). The exact layering combinations of each of the particular layer will depend on the specific end-use of the multi-layered structure, the materials used for each layer, the properties of the materials used in each layer (e.g., heat resistance, cost, chemical resistance, impact-resistance requirements, aesthetics, and the like.

Figure 19B:
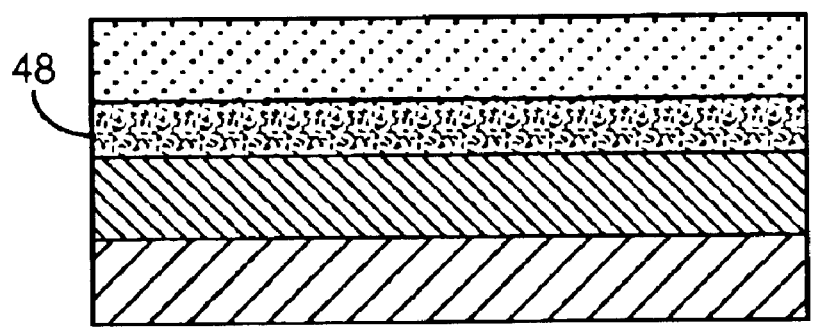
FIGS. 19A and 19B illustrate a thin electronic package disposed within the multi-layered structure of the present invention.
Figure 19A:
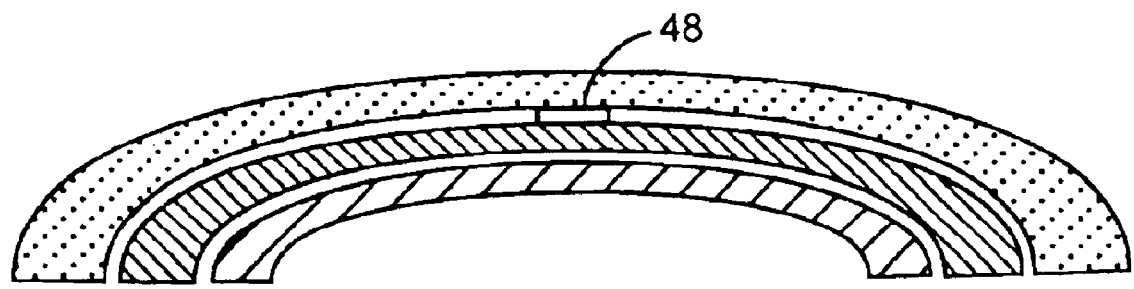

Referring again to FIG. 11, the present invention provides improved shielded electronic housings for both wireless and fixed electronic devices. As shown in FIGS. 19A and 19B, it may be possible to add a small, thin electronics package 48 to the layer combinations. The thin electronics packages could be used for antennas, sensors, lights, MEMS (micro electromechanical systems) or the like. The electronics can, but is not limited to, being placed between the film layer (decorated or not decorated) and the metal shielding layer. Such a combination would allow the electronics packaged to be shielded from the internal noise from the electronics contained within the housing.

Figure 20:
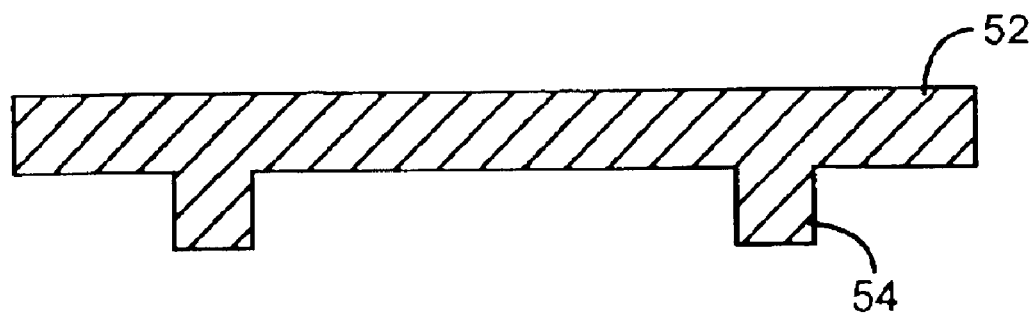
FIGS. 20 to 22 illustrates various methods of grounding an electronic housing with a ground trace of the printed circuit board.
Figure 20:
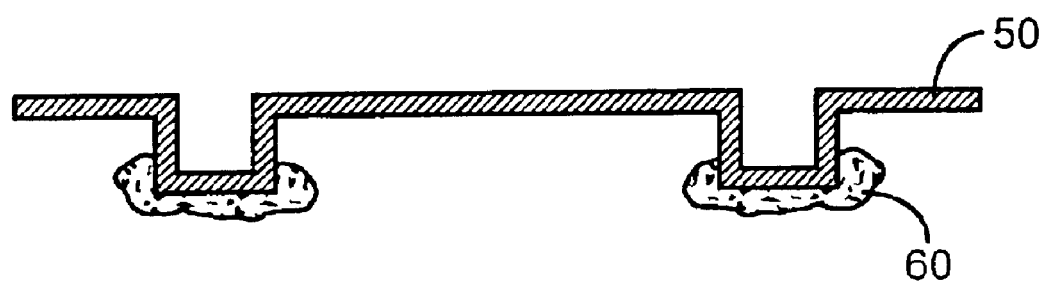
Figure 20:
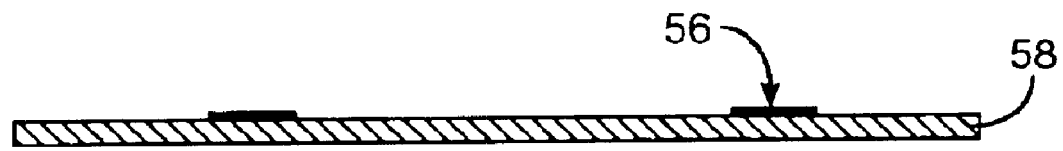

In order for the electronic devices and electronic housings of the present invention to be shielded, the metallized layer in the multi-layered substrate must be grounded, typically to the PCB ground traces disposed within the housing. FIGS. 20 to 21 illustrate two exemplary methods of grounding the metallized layer of the housing to the PCB. As shown in FIG. 20, in some embodiments of the present invention, a formed and metallized polymer insert 50 (such as a metallized polycarbonate layer) can be shaped to correspond with the shape of the outer housing 52. Thus, the outer housing can be retrofitted with a metallized substrate 50 to shield the electronic components disposed within the electronic enclosure. As illustrated in FIG. 20, oftentimes, the electronics enclosure 52 can include support ribs 54 that can contact the grounding traces 56 of a printed circuit board 58. To ground the metallized substrate 50 to the ground traces of the printed circuit board, a solder paste 60 can be deposited onto the metallized substrate 50 over the ground traces 56 and soldered or heat reflow soldered to the printed circuit board.

Figure 21A:
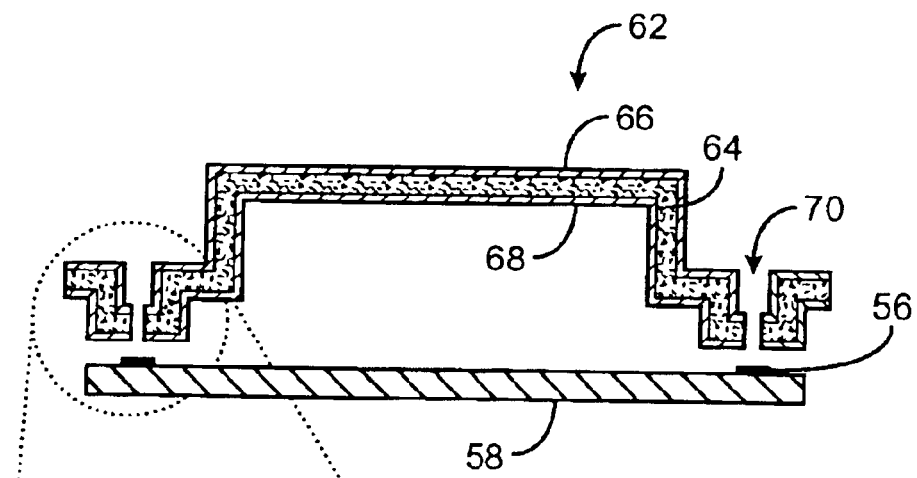
Figure 21B:
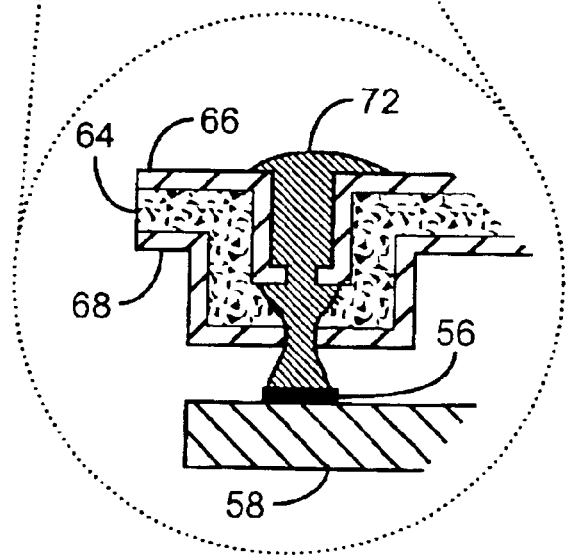

FIGS. 21A and 21B shows a formed shield 62 that is coupled to a printed circuit board 58. As shown, the formed shield includes a metal layer 64 sandwiched between two shaped polymer inserts 66, 68. As noted above, metal layer 64 is typically vacuum metallized onto one of the polymer inserts. However, it should be appreciated that one or more layers can be applied using any of the variety of methods described above. In order for the sandwiched metal layer 64 to be grounded to the ground trace 56, a via 70 can be formed through shield 62. The via 70 can then be filled with a molten solder or conductive adhesive 72 to create a conductive path between ground trace 56 and metal layer 64. Advantageously, the molten solder will have a tendency to be pulled in between the two polymer layers along the metal fibers or metal layer so as to provide a stronger ground connection to the metal layer. Once the adhesive or solder has solidified, the solder can act as a rivet to both mechanically and conductively attach the shield to the printed circuit board. It should be appreciated however, that while the method illustrated in FIG. 21 shows a metal layer disposed between two polymer layers, the bonding method may work equally well with a shield having an exposed metal layer.

In addition to the methods illustrated in FIGS. 20, 21A and 21B, other methods can be used to conductively and mechanically attach the shield to the ground trace. For example, a solder, pressure activated adhesive, conductive adhesives or the like can be used to bond the metal layer to the ground traces. Additionally, laser heat, an ultrasonic weld, or the like can be used to melt or soften the portion of the metal layer disposed over the ground trace.

Figure 22:
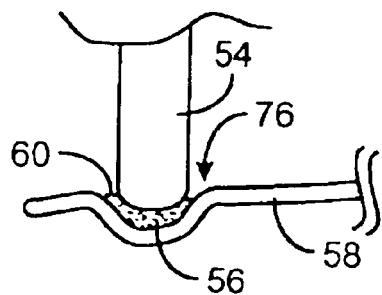

Finally, as shown in FIG. 22, during manufacturing of the printed circuit board, a well or indentation 76 can be created in the printed circuit board 58 in the locations of the grounding traces 56. These wells 76 can be adapted to receive a matching contour of the ribs 54 of the shield or housing. Advantageously, the wells 76 can increase the contact surface are between the shield and the ground traces and can provide a recess for the solder or conductive adhesive to pool during application.

While the above is a complete description of the preferred embodiments of the inventions, various alternatives, modifications, and equivalents may be used. For example, other combinations or the number of decorative layers, film layers, EMI shielding layers, resin layers, undercoats, overcoats, and can be used without departing from the scope of the present invention. Moreover, in addition to electronic housings and reflectors, the present invention can be used to provide unique decorative appearances particularly when used with clear or colored plastics. Although the foregoing has been described in detail for purposes of clarity of understanding, it will be obvious that certain modifications may be practiced within the scope of the appended claims.

What is claimed is:

1. A shielded plastic housing for an electronic component, the housing comprising:

an injection molded layer;

a thermoform layer comprising a metal layer that has a thickness sufficient to block transmission of electromagnetic interference, wherein one of the metal layer and thermoform layer is coupled to the injection molded layer; and a decorative layer coupled to one of the injection molded layer, the thermoform layer and the metal layer.

2. A method of shielding an electronic component of a printed circuit board, the method comprising:

providing a printed circuit board having an electronic component and a ground trace;

placing a housing comprising a metal shielding layer around the electronic component; and creating a via through a portion of the housing;

positioning the via over the ground trace; and depositing at least one of a conductive adhesive and a solder in the via to conductively ground the metal layer in the housing to the ground trace.

3. The method of claim 2 wherein the housing is an outer housing of an electronic device.

4. A method of shielding an electronic component of a printed circuit board, the method comprising:

providing a printed circuit board having an electronic component and a ground trace;

placing a shield that comprises a conductive layer around the electronic component;

creating a via through a portion of the shield;

positioning the via over the ground trace; and depositing a conductive element in the via to conductively ground the conductive layer in the shield to the ground trace.

5. The method of claim 4 wherein the conductive element is a conductive adhesive.

6. The method of claim 4 wherein the shield that comprises a conductive layer is a metallized polymer substrate.

7. The method of claim 4 wherein the shield is coupled to an outer housing of an electronic device.

8. A shielded plastic housing for an electronic component, the housing comprising:

a substantially rigid injection molded layer;

a thermoform insert comprising a metal layer that has a thickness sufficient to block transmission of electromagnetic interference, wherein one of the metal layer and thermoform insert is coupled to the injection molded layer; and a decorative layer selectively applied to at least a portion of one of the injection molded layer, the thermoform layer, and the metal layer, wherein the decorative layer has a thickness that is less than a thickness of the injection molded layer.

9. The housing of claim 8 wherein the metal layer is viewable through the injection molded layer.

10. The housing of claim 8 wherein the metal layer provides a reflective surface.

* * * * *